(12) United States Patent
Kimura (10) Patent No.: US 9,894,758 B2
(45) Date of Patent: Feb. 13, 2018

(54) THREE-DIMENSIONAL LAMINATED WIRING SUBSTRATE

(71) Applicant: Tyco Electronics Japan G.K., Kanagawa (JP)

(72) Inventor: Takeshi Kimura, Kanagawa-ken (JP)

(73) Assignee: Tyco Electronics Japan G.K., Kanagawa-ken (JP)

(*) Notice: Subject to any disclaimer, the term of this patent is extended or adjusted under 35 U.S.C. 154(b) by 518 days.

(21) Appl. No.: 14/472,976

(22) Filed: Aug. 29, 2014

(65) Prior Publication Data

US 2014/0368969 A1 Dec. 18, 2014

Related U.S. Application Data

(63) Continuation of application No. PCT/JP2013/052182, filed on Jan. 31, 2013.

(30) Foreign Application Priority Data

Mar. 6, 2012 (JP) ................................. 2012-049413

(51) Int. Cl.
| | |
|---|---|
| *H01G 4/30* | (2006.01) |
| *H05K 7/10* | (2006.01) |
| *H05K 7/12* | (2006.01) |
| *H05K 1/09* | (2006.01) |
| *H05K 1/02* | (2006.01) |
| *H05K 3/46* | (2006.01) |
| *H01G 4/005* | (2006.01) |

(Continued)

(52) U.S. Cl.
CPC .......... *H05K 1/0284* (2013.01); *H01G 4/005* (2013.01); *H01G 4/30* (2013.01); *H05K 1/0298* (2013.01); *H05K 3/4614* (2013.01); *H05K 1/162* (2013.01); *H05K 3/0014* (2013.01); *H05K 2201/042* (2013.01); *H05K 2201/2036* (2013.01)

(58) Field of Classification Search
CPC ...... H05K 1/0284; H05K 1/0298; H05K 3/46; H01G 4/30
USPC ............................... 361/301.4, 766; 174/251
See application file for complete search history.

(56) References Cited

U.S. PATENT DOCUMENTS

| | | | | |
|---|---|---|---|---|
| 5,264,061 | A | 11/1993 | Juskey et al. | |
| 6,492,007 | B1 * | 12/2002 | Iinaga | B32B 3/02 174/250 |
| 2001/0002727 | A1 * | 6/2001 | Shiraishi | H01L 21/563 257/685 |

FOREIGN PATENT DOCUMENTS

| | | |
|---|---|---|
| EP | 1209959 A2 | 5/2002 |
| GB | 2255451 A | 11/1992 |

(Continued)

OTHER PUBLICATIONS

PCT International Preliminary Report on Patentability, International Application No. PCT/JP2013/052182, dated Sep. 9, 2014, 7 pages.

(Continued)

*Primary Examiner* — Eric Thomas
*Assistant Examiner* — Arun Ramaswamy
(74) *Attorney, Agent, or Firm* — Barley Snyder (57) ABSTRACT

A three-dimensional laminated wiring substrate is provided and includes a plurality of wiring substrates disposed on top of each other. Each of the plurality of wiring substrates includes an insulating film and a conductor pattern. The insulating film is disposed along a surface to provide a three-dimensional surface. The conductor pattern is disposed on and extending along the three-dimensional surface.

13 Claims, 6 Drawing Sheets

(51) Int. Cl.
*H05K 1/16* (2006.01)
*H05K 3/00* (2006.01)

(56) References Cited

FOREIGN PATENT DOCUMENTS

| | | |
|---|---:|---:|
| JP | 58-34790 | 3/1983 |
| JP | 1-169083 | 11/1989 |
| JP | 7170077 A | 7/1995 |
| JP | 09266368 A | 10/1997 |
| JP | 2007-123940 | 5/2007 |
| JP | 2009-164340 | 7/2009 |
| JP | 2010-27724 | 2/2010 |
| JP | 10-140638 | 6/2010 |
| JP | 2012-36339 | 2/2012 |
| WO | 2008120513 A1 | 10/2008 |

OTHER PUBLICATIONS

International Search Report for co-pending PCT Application—PCT/JP2013/052182, dated Mar. 12, 2013, 6 pages.
European Search Report, Application No. 13758350.6, dated Nov. 25, 2015, 7 pages.
Abstract of JPH09266368, dated Oct. 7, 1997, 1 page.

\* cited by examiner

THREE-DIMENSIONAL LAMINATED WIRING SUBSTRATE

CROSS-REFERENCE TO RELATED APPLICATIONS

This application is a continuation of PCT application No. PCT/JP2013/052182 filed on Jan. 31, 2013, which claims the benefit of the filing date under 35 U.S.C. § 119(a)-(d) of JP Patent Application No. 2012-049413 filed on Mar. 6, 2012.

FIELD OF THE INVENTION

The invention relates to a wiring substrate and, more particularly, to a three-dimensional laminated wiring substrate.

BACKGROUND

It is well known that a flexible substrate, for example, is folded along a folding line and is positioned in a limited space in a case to provide a circuit or wiring. For example, JP 09-266368 A discloses a known three-dimensional circuit substrate obtained by forming a copper foil into a three-dimensional shape in advance, and molding the copper foil and a prepreg sheet with a molding die in a hot-press manner.

Since known flexible substrates are generally two-dimensional flat sheets, the known flexible substrate can form a folded flat sheet, but a circuit or wiring cannot be formed so as to cover faces spreading in three dimensions corresponding to length, width, and height at a corner of a three-dimensional object for example. The same applies to the known three-dimensional circuit substrate of the prior art, where a copper foil disposed on a two-dimensional plane is folded along a folding line on this plane. For example, even if a projection, for example, can be formed on the copper foil according to the technique of prior art, there is a possibility that, when the copper foil is hot-pressed together with the prepreg sheet having a shape corresponding to this copper foil, a crease or a distortion might occur in the copper foil or the copper foil might be cut in the middle.

SUMMARY

The present invention has been made in order to solve the above problem and an object thereof is to provide a three-dimensional laminated wiring substrate that can be housed in a restricted space, and that enables highly reliable high-density wiring.

The three-dimensional laminated wiring substrate includes a plurality of wiring substrates disposed on top of each other. Each of the plurality of wiring substrates includes an insulating film and a conductor pattern. The insulating film is disposed along a surface to provide a three-dimensional surface. The conductor pattern is disposed on and extending along the three-dimensional surface.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EMBODIMENT(S)

Embodiments of the present invention will be described below with reference to the drawings.

Figure 1:
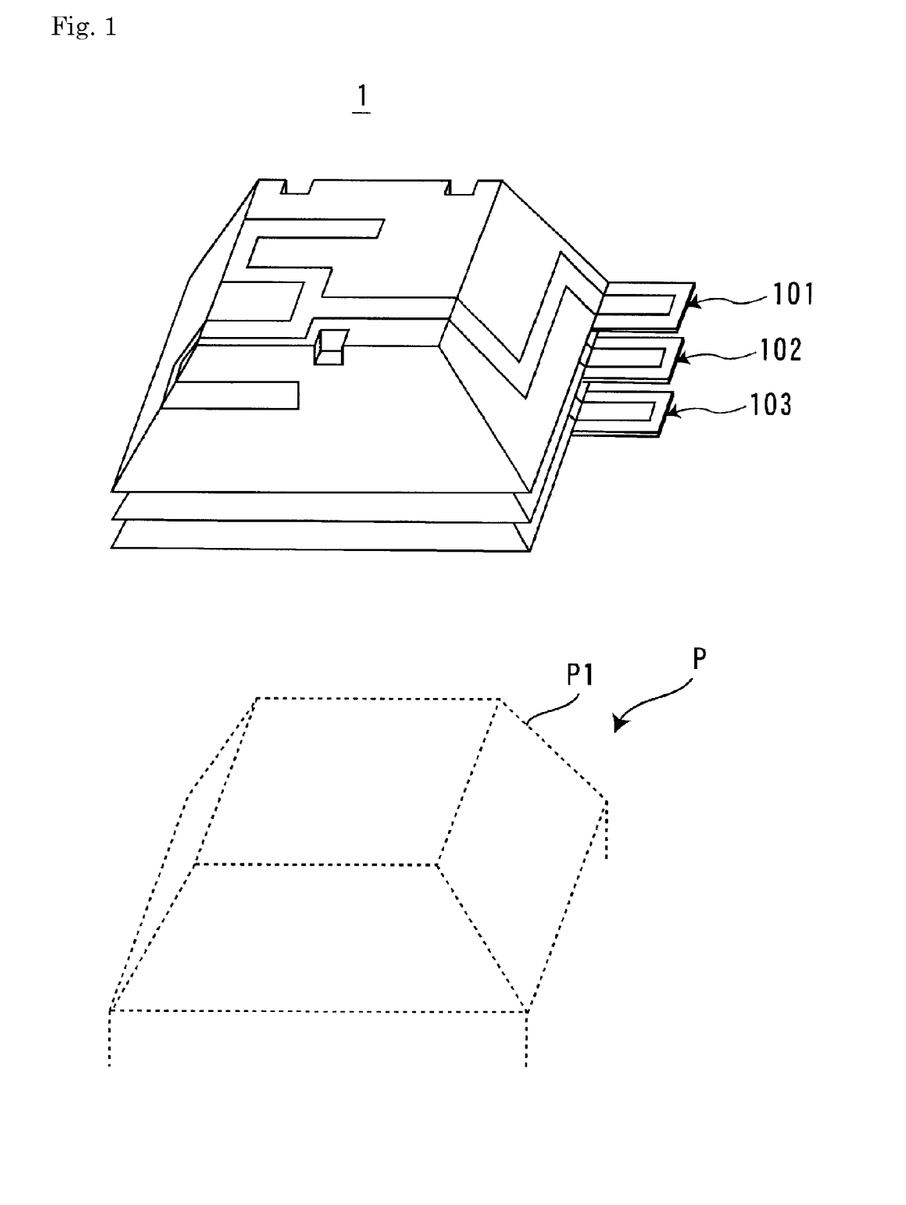
FIG. 1 is a perspective view of a three-dimensional laminated wiring substrate according to the invention.

With reference to FIG. 1, a three-dimensional laminated wiring substrate 1 according to the invention is shown and includes a substrate having a shape adapted to a space in which the three-dimensional laminated wiring substrate 1 is disposed. Specifically, the three-dimensional laminated wiring substrate 1 has a three-dimensional shape for being disposed in a space between members. In an exemplary embodiment of the invention, the three-dimensional laminated wiring substrate 1 is, for example, disposed at a corner in a case of an electronic device (not shown), and disposed in a space between the case and another component P disposed in the case.

As shown, the three-dimensional laminated wiring substrate 1 of the shown embodiment has a truncated-pyramid outer shape so as to cover a truncated pyramid portion P1 of another component P shown in broken line in FIG. 1.

The shown three-dimensional laminated wiring substrate 1 is a wiring substrate having three circuits. More specifically, the three-dimensional laminated wiring substrate 1 is provided with three types of antenna elements having different characteristics. Three external connection terminals 101, 102, 103 are provided on an edge of the three-dimensional laminated wiring substrate 1. Lead wires or other circuit substrates (not shown) are connected to the external connection terminals 101, 102, 103.

Figure 2:
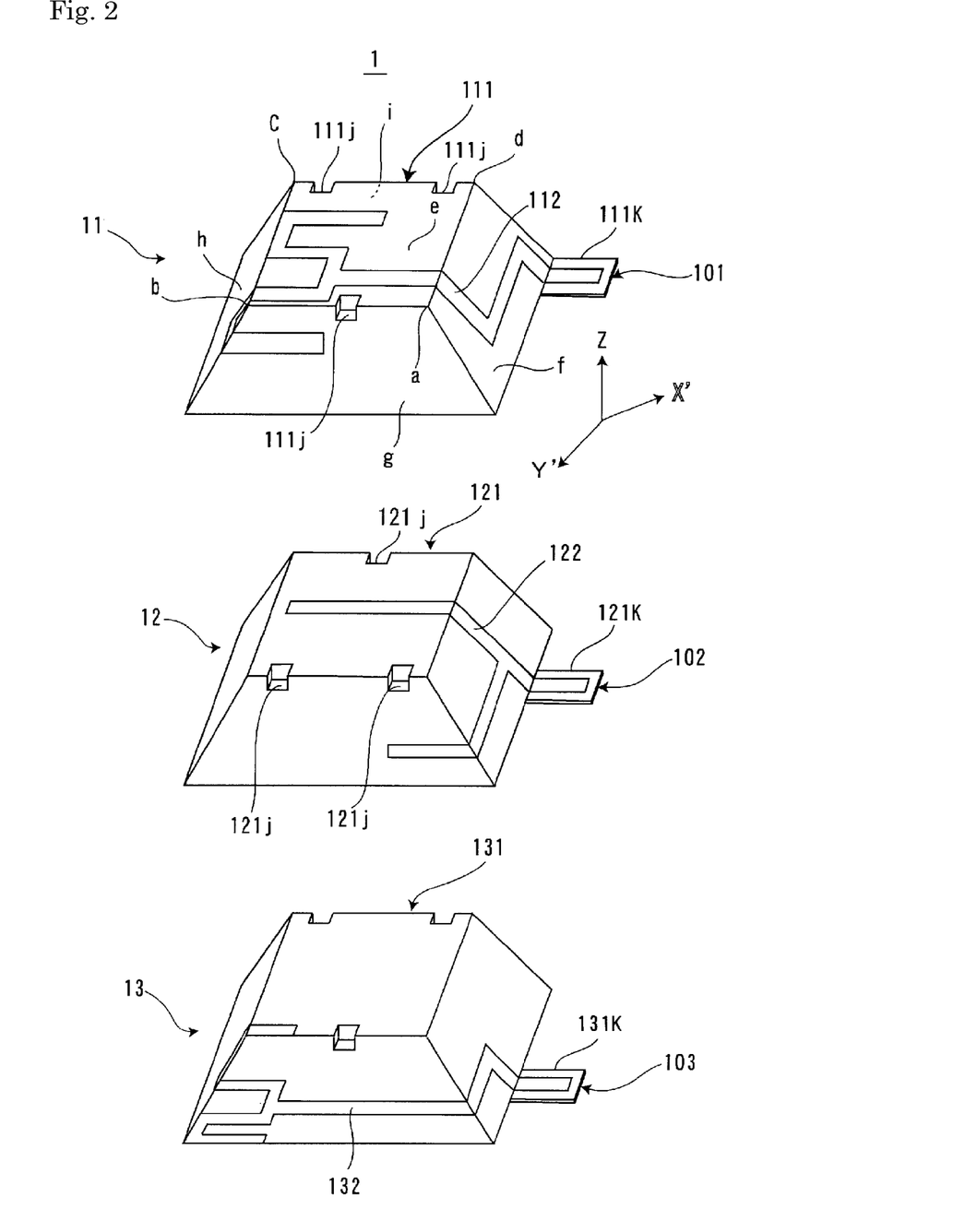
FIG. 2 is an exploded perspective view of the three-dimensional laminated wiring substrate shown in FIG. 1.

As shown FIG. 2, the three-dimensional laminated wiring substrate 1 has three wiring substrates 11, 12, 13 stacked one on top of another. It should be noted that the wiring substrates 11, 12, 13 are also referred to as first substrate 11, second substrate 12, and third substrate 13, respectively, from top to bottom in FIG. 2. First, the first substrate 11 will be described regarding a common configuration to the wiring substrates 11, 12, 13.

The first substrate 11 is provided with an insulating film 111 and a conductor pattern 112.

The insulating film 111 is a film made from a resin material. The resin material is a thermoplastic or thermosetting resin. The resin materials may include polyethylene terephthalate (PET), polycarbonate (PC), polyimide, and polyphenylene sulfide (PPS), for example. The insulating film 111 is formed as a three-dimensional surface. The three-dimensional surface is not obtained by simply folding a flat-sheet-like film along folding lines but includes a portion projecting beyond a surrounding portion thereof.

The insulating film 111 of the shown embodiment, having a three-dimensional surface, has a truncated-pyramid-like outer shape with the bottom opened. More specifically, a top face e of the insulating film 111 has four apexes a, b, c, d, which are corners.

First, with reference with apex a of the four apexes a, b, c, d, the apex a is in contact with faces f, g, e facing in three-dimensional directions independent of each other, which are a lateral direction (obliquely lateral direction X'), a longitudinal direction (obliquely longitudinal direction Y'), and a height direction Z. The apex a has a shape projecting relative to an annular region passing through the faces f, g, e and surrounding this apex a. The same applies to the remaining three apexes b, c, and d. In addition, focusing on the top face e of the insulating film 111 of the shown embodiment, the top face e projects beyond four slanting faces f, g, h, i being in contact with four sides of the top face e and surrounding the top face e. Such a three-dimensional surface of the insulating film 111 cannot be formed by simply folding a flat-sheet-like film along folding lines and is therefore formed, for example, by hot-pressing a flat-sheet-like film with a forming die. The method of forming the insulating film 111 will be described later.

The insulating film 111 of the first substrate 11 is provided with three spacer projections 111j. The spacer projections 111j project toward the second substrate 12 adjacent to the first substrate 11. The spacer projections 111j abut on the second substrate 12 when the first substrate 11 is stacked on the second substrate 12. This provides a clearance section between the first substrate 11 except the spacer projections 111j and the second substrate 12.

In addition, the insulating film 111 is provided with a extension 111k projecting from an edge thereof. The conductor pattern 112 of the first substrate 11 extends up to a top of the extension 111k. The conductor pattern 112 on the extension 111k represents the external connection terminal 101.

The structure of the first substrate 11 described above is also universal to the second substrate 12 and the third substrate 13. The first substrate 11, the second substrate 12, and the third substrate 13 each have a similar, if no substantially the same, three-dimensional surface. Further, the first substrate 11, the second substrate 12, and the third substrate 13, as shown in FIG. 1, are stacked so that their three-dimensional surfaces are aligned with each other.

The spacer projections 111j of the first substrate 11 and the spacer projections 121j of the second substrate 12 are disposed at different positions. This prevents the spacer projection 111j of the first substrate 11 from falling into the spacer projection 121j of the second substrate 12 when the first substrate 11 is stacked on the second substrate 12. More specifically, the spacer projections 111j of the first substrate 11 and the spacer projections 121j of the second substrate 12 are so provided as to be symmetrical about the center of the top face. Therefore, the first substrate 11 and the second substrate 12 can be manufactured from a common forming die, and disposing the first substrate 11 and the second substrate 12 in opposing positions.

The extension 111k of the first substrate 11, the extension 121k of the second substrate 12, and the extension 131k of the third substrate 13 are positioned so that they do not overlap with each other. Therefore, in the three-dimensional laminated wiring substrate 1, contact between three external connection terminals 101, 102, 103 formed on the extensions 111k, 121k, 131k is avoided. In addition, each of the external connection terminals 101, 102, 103 is clearly visible, which results in ease of connection work with another component or lead wire.

Conductor patterns 112, 122, 132 have different shapes from each other and are positioned on the first substrate 11, the second substrate 12, and the third substrate 13 in the shown embodiment. The conductor pattern 112 is formed from a conductive metal material, which may include copper, nickel, or gold, for example. More specifically, the insulating films 111, 121, 131 include a plating catalyst printed thereon, and the wiring substrates 11, 12, 13 have a structure plated by the action of the plating catalyst.

The conductor patterns 112, 122, 132 extend on the three-dimensional surfaces of the insulating films 111, 121, 131, respectively, and extends up to the extensions 111k, 121k, 131k. The conductor patterns 112, 122, 132 function as three antenna elements using the external connection terminals 101, 102, 103 as feeding points. These antenna elements have emission characteristics different from each other according to the shapes of the conductor patterns 112, 122, 132 disposed on the three-dimensional surfaces. For example, the conductor pattern 112 of the first substrate 11 and the conductor pattern 132 of the third substrate 13 have similar frequency characteristics as an antenna, but have different emission distributions in a space. In addition, the conductor pattern 112 and the conductor pattern 122 have different frequency characteristics.

An electronic device (not shown) provided with the three-dimensional laminated wiring substrate 1 shown in FIG. 1 uses the three types of antennas selectively or simultaneously according to the situation. By using the three-dimensional laminated wiring substrate 1, the three types of antennas can be housed in a restricted space such as a corner of the electronic device, for example.

In the shown embodiment, the first substrate 11, the second substrate 12, and the third substrate 13 each have a similar three-dimensional surface, and are stacked one on top of another with the three-dimensional surfaces aligned with each other. Therefore, it is easy to position the conductor patterns 112, 122, 132 mutually during assembly. Further, characteristic fluctuations due to interaction or individual differences between products are reduced.

Now with reference to FIG. 3, manufacturing steps of the three-dimensional laminated wiring substrate 1 will be discussed.

Figure 3:
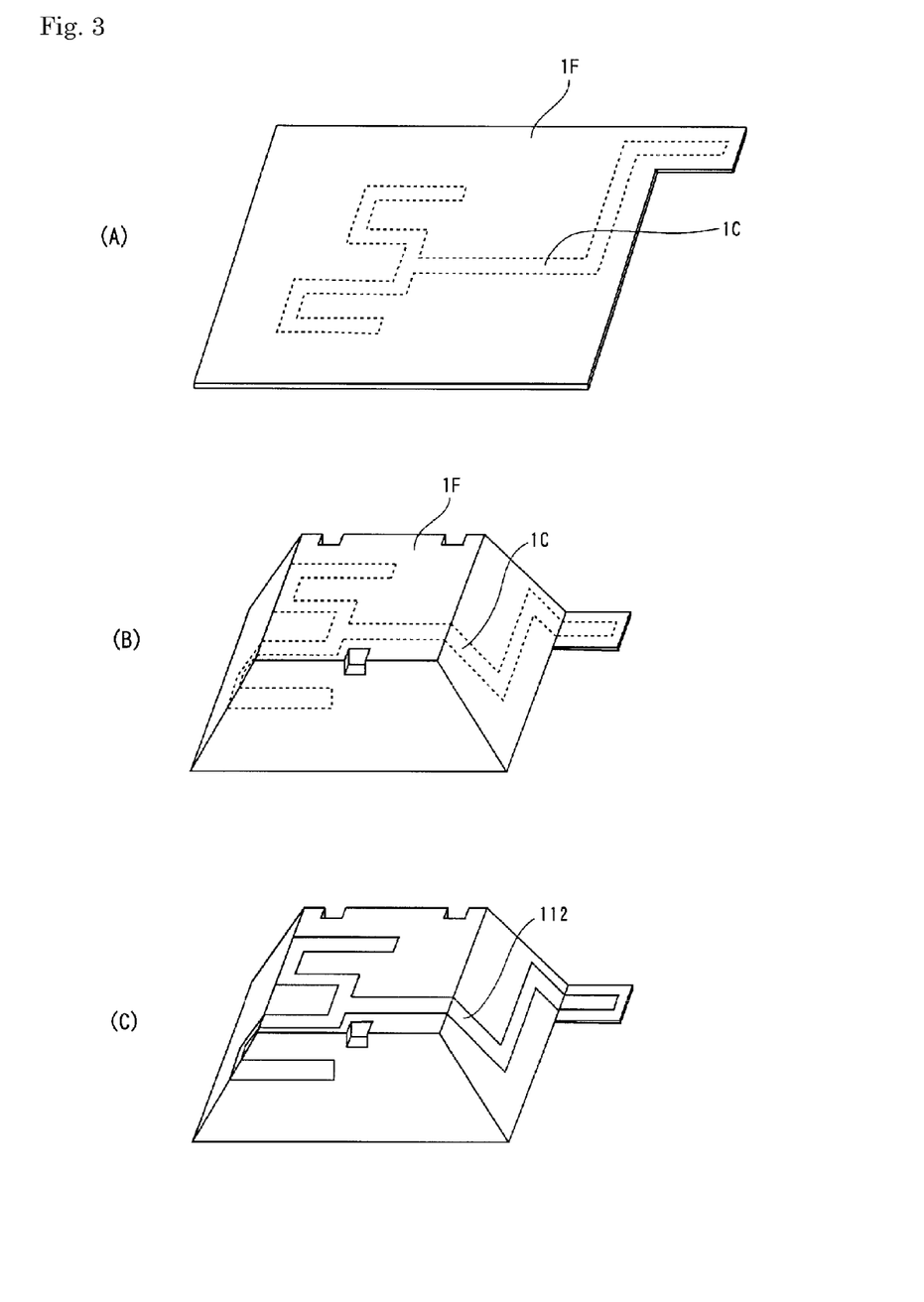
FIG. 3 is schematic diagram show manufacturing steps of the three-dimensional wiring substrate according to the invention.

Steps (A) to (B) of FIG. 3 sequentially show manufacturing steps of the first substrate 11 as an example. In this regard, the second and third substrates are also manufactured according to the same steps.

In order to manufacture the first substrate 11, first, as shown in Part (A) of FIG. 3, a plating catalyst 1C is printed on a resin insulating film 1F spreading like a flat sheet. The plating catalyst may be a conductive polymer, for example. It should be noted that before printing the plating catalyst 1C, etching or under layer treatment may be performed.

Next, as shown in step (B) of FIG. 3, the insulating film 1F is heated and molded with a forming die so as to provide the three-dimensional surface. The forming method may be a vacuum forming method in which the insulating film 1F is sucked to a die by air suction, a pressure forming method in which the insulating film 1F is pressed to a die by pushing air out, a mechanical embossing method, or the like, for example.

Next, as shown in step (C) of FIG. 3, the formed insulating film is applied with chemical plating using the plating catalyst 1C. The conductor pattern 112 made of metal is formed on the portion printed with the plating catalyst 1C. The first substrate 11 is thus completed.

Since plating is performed after the insulating film 1F is formed, the metal conductor pattern 112 is continuously formed without a break along an apex or a ridge line of the three-dimensional surface. Therefore, even if a complicated conductor pattern is formed on a three-dimensional surface, the reliability of connection is high.

Finally, the completed first substrate 11, and the second substrate 12 and the third substrates 13 (see FIG. 2) which have been manufactured in the same manner as the first substrate 11 are stacked one on top of another, and fixed to each other with an adhesive or the like. In this manner, the three-dimensional laminated wiring substrate 1 shown in FIG. 1 is completed.

Incidentally, it is conceivable that a shape similar to the three-dimensional surface shown in FIG. 2 can be formed, for example, by making slits in a flat-sheet-like flexible substrate while assuming the development view of a three-dimensional object, folding the flexible substrate, and further connecting and bonding the edges. In this case, however, the conductor pattern cannot be made continuous across a portion of the three-dimensional surface where the slit is connected and bonded. Therefore, the shape of the conductor pattern is restricted. In addition, formation of a three-dimensional surface is complicated, and therefore difficult to be automated.

Further, in a case where a shape similar to the three-dimensional surface shown in FIG. 2 should be manufactured by injection molding or the like, the thickness of a substrate to be formed needs to be thick enough to be formed by injection molding. Therefore, such a substrate cannot be stacked and disposed in such a narrow space as a clearance in an article.

Further, in a case where a multilayered conductor pattern is disposed on a flexible substrate which does not have a three-dimensional surface, formation of a conductor pattern and formation of an insulating layer need to be repeated alternately. Therefore, formation of a multilayered structure is time-consuming. In contrast, the three-dimensional laminated wiring substrate 1 of the shown embodiment makes it possible to perform formations of respective layers substantially simultaneously, and combine the three-dimensional surfaces in alignment with each other, thereby performing positioning between the layers. Therefore, a multilayered substrate circuit can be manufactured in a short time with high placement precision.

The three-dimensional laminated wiring substrate 1 thus manufactured makes it possible to densely dispose complicated conductor patterns having high connection reliability on the three-dimensional surface adapted to a limited location in an electronic device or the like.

In the three-dimensional laminated wiring substrate 1 of the shown embodiment described above, the conductor patterns are formed only on one face, namely, the respective upward convex faces of the first substrate 11, the second substrate 12, and the third substrate 13.

Now with reference to FIG. 4, another three-dimensional laminated wiring substrate 2 according to the invention will be discussed, where conductive patterns are formed on concave faces of the substrates, or both faces thereof.

Figure 4:
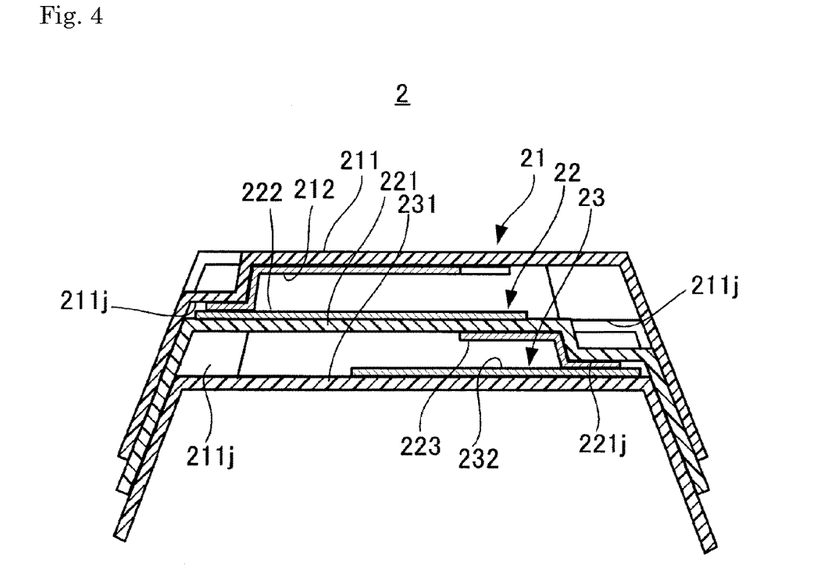
FIG. 4 is a sectional view a three-dimensional laminated wiring substrate according to the invention.

The three-dimensional laminated wiring substrate 2 shown in FIG. 4 is provided with a first substrate 21, a second substrate 22, and a third substrate 23. On the lowermost third substrate 23, a conductor pattern 232 is provided on a convex face of an insulating film 231 in the same manner as the shown embodiment. On the other hand, on the uppermost first substrate 21, a conductor pattern 212 is provided on a concave face of an insulating film 211. Further, on the second substrate 22, conductor patterns 222, 223 are provided on both faces of an insulating film 221. It should be noted that, in FIG. 4, the thicknesses of the insulating films and the conductor patterns are exaggeratedly shown.

The conductor pattern 212 of the first substrate 21 extends along a surface of a spacer projection 211j of the insulating film 211, and is in contact with the conductor pattern 222 of the second substrate 22. Therefore, the conductor patterns 212, 222 of the first substrate 21 and the second substrate 22 adjacent to each other provide a circuit.

The conductor pattern 223, which is disposed on the opposite side of the second substrate 22 from the conductor pattern 222, extends along a surface of a spacer projection 221j of the insulating film 221, and is in contact with the conductor pattern 232 of the third substrate 23. Therefore, the conductor patterns 233, 232 of the second substrate 22 and the third substrate 23 adjacent to each other provide a circuit. It should be noted that the conductor patterns 223, 232 may be joined to each other using soldering, a conductive adhesive, or the like.

Thus, according to the three-dimensional laminated wiring substrate 2, a circuit can be provided by utilizing two adjacent substrates 21, 22. Further, as clearly shown in FIG. 4, since the spacer projections 211j, 221j keep a clearance between the substrates, unnecessary constant between the conductor patterns except the spacer projections 211j 221j is avoided.

Now with reference to FIG. 5, another three-dimensional laminated wiring substrate 3 according to the invention will be discussed.

Figure 5:
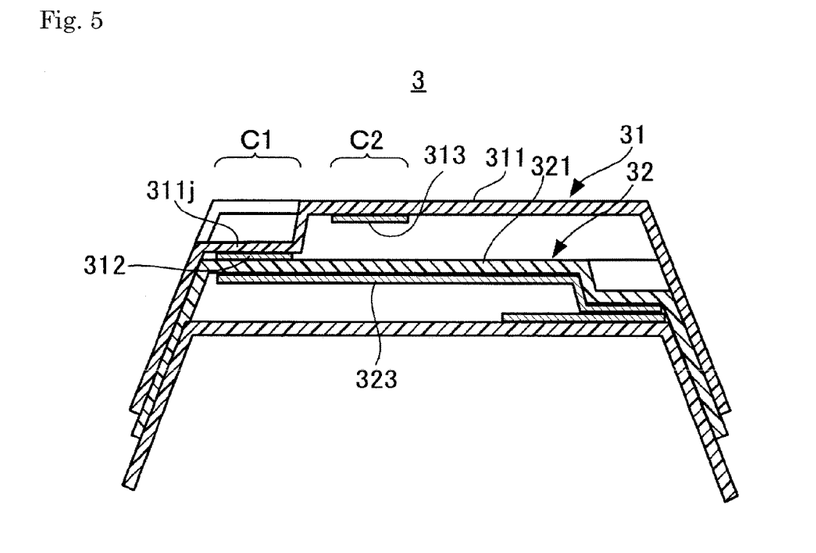
FIG. 5 is a sectional view of another three-dimensional laminated wiring substrate according to the invention.

In the three-dimensional laminated wiring substrate 3 shown in FIG. 5, a horizontal length of a spacer projection 311j formed on an insulating film 311 of a first substrate 31 is longer than that of the spacer projection 211j in the embodiment shown in FIG. 4. In addition, a conductor pattern 312 spreading like a flat sheet is provided on a surface of the spacer projection 311j. Further, on the insulating film 311, another conductor pattern 313 spreading like a flat sheet is provided in a position separate from the conductor pattern 312.

No conductor pattern is provided on a convex face of an insulating film 321 of a second substrate 32. A conductor pattern 323 spreading like a flat sheet is provided on a concave face of the second substrate 32 including regions corresponding to the conductor patterns 312, 313 of the first substrate 31.

A first capacitor element C1 is formed by the conductor pattern 323 of the second substrate 32 and the conductor pattern 312 of the first substrate 31. The first capacitor element C1 has an electrostatic capacity according to an overlapped area between the conductor patterns 323, 312 which serve as a pair of parallel plate electrodes, and the thickness and dielectric constant of the insulating film 321. In addition, a second capacitor element C2 is formed by the conductor pattern 323 of the second substrate 32 and the other conductor pattern 313 of the first substrate 31. The second capacitor element C2 has an electrostatic capacity according to an overlapped area between the conductor patterns 323, 313 which serve as a pair of parallel plate electrodes, the thickness and dielectric constant of the insulating film 321, the height of the spacer projection 311j, and the dielectric constant of air. The electrostatic capacity of the second capacitor element C2 can be adjusted according the height of the spacer projection 311j.

Figure 6:
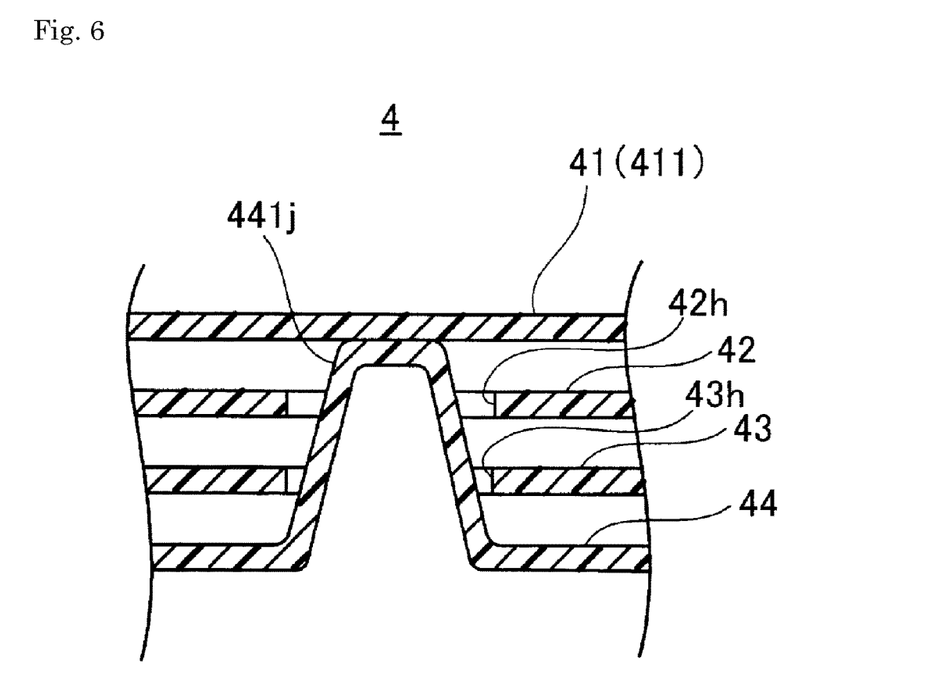
FIG. 6 is a close-up sectional view of another three-dimensional laminated wiring substrate according to the invention.

Now with reference to FIG. 6, another three-dimensional laminated wiring substrate 4 according to the invention will be discussed. The three-dimensional laminated wiring substrate 4 includes a laminate of four wiring substrates which are a first substrate 41, a second substrate 42, a third substrate 43, and a fourth substrate 44. The second substrate 42 and the third substrate 43 are disposed between the first substrate 41 and the fourth substrate 44. The second substrate 42 and the third substrate 43 each correspond to an example of an intermediate three-dimensional wiring substrate disclosed in the present invention.

Projection receiving passageways 42h, 43h are provided in the second substrate 42 and the third substrate 43, respectively. A spacer projection 441j provided on the fourth substrate 44 abuts on the first substrate 41 through the projection receiving passageways 42h, 43h.

Figure 7:
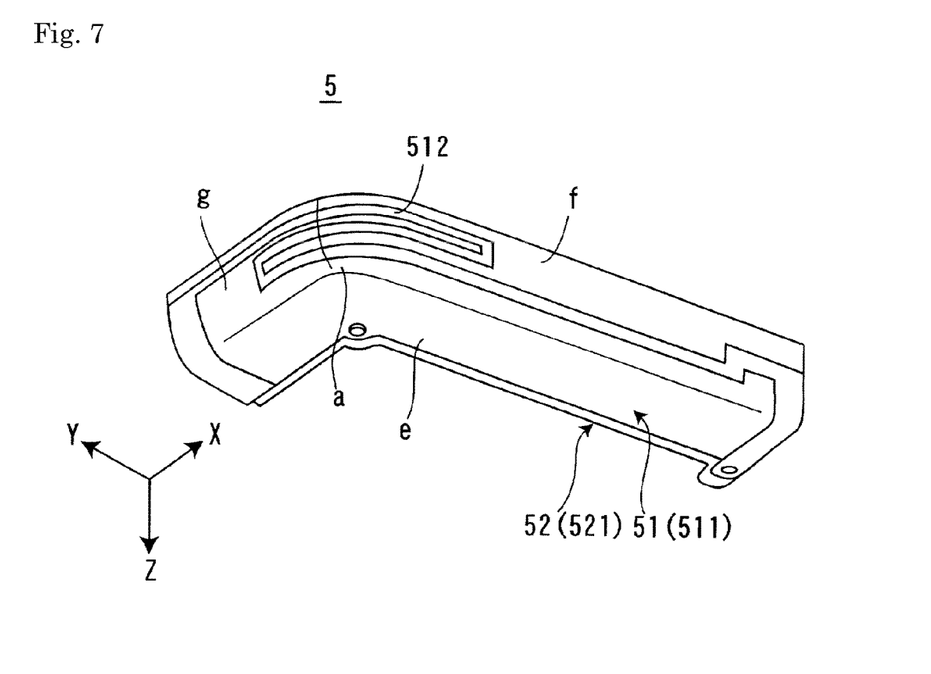
FIG. 7 is a perspective view of another three-dimensional laminated wiring substrate according to the invention.

Now with reference to FIG. 7, a three-dimensional laminated wiring substrate 5 according to the invention will be discussed. The three-dimensional laminated wiring substrate 5 is a laminate of a first substrate 51 and a second substrate 52 which are two wiring substrates. The first substrate 51 and the second substrate 52 are provided with insulating films 511, 521, respectively, formed to provide a three-dimensional surface. More specifically, the three-dimensional surface of an insulating film 511 has a projecting shape like a trigonal pyramid with faces f, g, e in contact with each other at an apex a, the faces f, g, e facing in mutually independent directions in three dimensions that are a lateral direction X, a longitudinal direction Y, and a height direction Z. The second substrate 52, which is disposed behind (on the back side of) the first substrate, has the same shape. The first substrate 51 and the second substrate 52 are stacked one on top of the other to align the three-dimensional surfaces, more specifically, the apexes a, with each other. A conductor pattern 512, which functions as an antenna element, extends along the three-dimension surface of the insulating film 511 of the first substrate 51. In addition, a conductor pattern (not shown) that functions as an antenna element and has a different shape from the conductor pattern on the first substrate 51 is also formed on the insulating film 521 of the second substrate that is disposed inside the first substrate 51.

Figure 8:
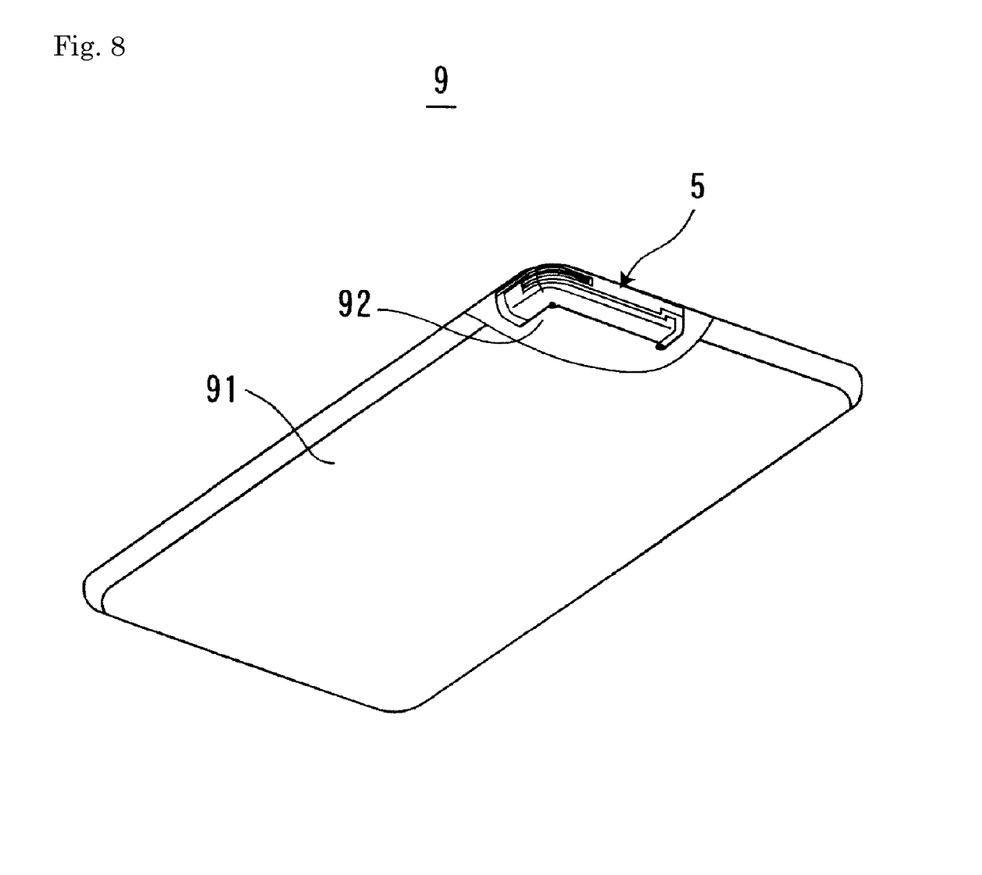
FIG. 8 is another perspective view of the three-dimensional laminated wiring substrate of FIG. 7.

Now with FIG. 8, a mobile communication terminal device 9 having the three-dimensional laminated wiring substrate of FIG. 7 will be discussed.

An example of the mobile communication terminal device 9 is a smartphone. The mobile communication terminal device 9 has a thin rectangular-parallelepiped-like shape, and the three-dimensional laminated wiring substrate 5 shown in FIG. 7 is mounted in a clearance between a case 91 and a built-in component 92 and, more specifically, along a corner of the mobile communication terminal device 9. Since the three-dimensional laminated wiring substrate 5 has the structure where the first substrate 51 and the second substrate 52 are stacked one on top of the other, two types of antennas can be built in a limited clearance in the mobile communication terminal device 9.

It should be noted that, in the embodiments described above, a conductor pattern providing an antenna element is shown as an example of a conductor pattern according to the invention. However, this is not intended to limit the present invention, and the conductor pattern may constitute an ordinary closed circuit, for example. In addition, an electronic component may be mounted on the conductor pattern. Therefore, the three-dimensional laminated wiring substrate of the present invention may be applied to a device which does not have a communication function.

Further, in the embodiments described above, structures where two to four substrates are stacked are shown as examples of the three-dimensional laminated wiring substrate disclosed in the present invention. However, this is not intended to limit the present invention, and the number of wiring substrates to be stacked may be five or more, for example.

Further, in the embodiments described above, the shape of a truncated pyramid and the shape of a pyramid are shown as an example of the shape of a three-dimensional surface disclosed in the present invention. This, however, is not intended to limit the present invention, and the shape of the three-dimensional surface may be spherical or columnar, for example. In addition, the three-dimensional wiring substrate may be a flat-sheet partially provided with the three-dimensional surface.

Further, in the embodiments described above, the projection receiving passageways 42h, 43h are shown as examples of a hole or a notch disclosed in the present invention. This, however, is not intended to limit the present invention, and the spacer projection may extend through a notch, for example.

Further, in the embodiments described above, the three-dimensional wiring substrate having the extension 111k is shown as an example of a three-dimensional wiring substrate disclosed in the present invention. This, however, is not intended to limit the present invention, and the three-dimensional wiring substrate may have no extension, for example.

Further, in the embodiments described above, the substrates provided with conductor patterns having different shapes are shown as examples of a plurality of wiring substrates disclosed in the present invention. This, however, is not intended to limit the present invention, and the plurality of wiring substrates may be provided with a conductor pattern having the same shape, as in the case of constituting an array antenna, for example.

Further, as an example of a three-dimensional laminated wiring substrate disclosed in the present invention, elements of the embodiments described above may be used in combination or replaced. For example, on both faces of each substrate of the three-dimensional laminated wiring substrate of the shown embodiment or the fifth embodiment, the conductor patterns in the second embodiment may be provided, or the capacitor in the third embodiment may be formed.

As described above, according to the invention, a three-dimensional laminated wiring substrate that can be housed in a restricted space and that enables highly reliable high-density wiring is realized.

Although exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A three-dimensional laminated wiring substrate comprising:
   a plurality of wiring substrates disposed on top of each other, the plurality of wiring substrates including a pair of outer wiring substrates and an intermediate wiring substrate positioned between the pair of outer wiring substrates,
   each of the plurality of wiring substrates having:
      an insulating film disposed along a surface thereof to provide a three-dimensional surface; and a conductor pattern disposed on and extending along the three-dimensional surface to form a parallel plate capacitor element with one of the conductor patterns of an adjacent one of the wiring substrates;

the intermediate wiring substrate having a projection receiving passageway; and one of the pair of outer wiring substrates including a spacer projection formed of the insulating film extending through the projection receiving passageway and abutting a surface of another of the pair of outer wiring substrates.

2. The three-dimensional laminated wiring substrate according to claim 1, wherein each of the plurality of wiring substrates has substantially identical three-dimensional surfaces.

3. The three-dimensional laminated wiring substrate according to claim 2, wherein the plurality of wiring substrates is so stacked to align the substantially identical three-dimensional surfaces with each other.

4. The three-dimensional laminated wiring substrate according to claim 1, wherein the conductor patterns of the plurality of wiring substrates are spaced from each other.

5. The three-dimensional laminated wiring substrate according to claim 4, wherein each conductor pattern of the plurality of wiring substrates is different in shape from each other.

6. The three-dimensional laminated wiring substrate according to claim 1, further comprising a spacer projection positioned between a pair of the plurality of wiring substrates.

7. The three-dimensional laminated wiring substrate according to claim 6, wherein the spacer projection provides clearance between the pair of the plurality of wiring substrates.

8. The three-dimensional laminated wiring substrate according to claim 1, wherein the conductor pattern for the one of the pair of outer wiring substrates extends along the surface of the spacer projection and contacts the conductor pattern of the another of the pair of outer wiring substrates.

9. The three-dimensional laminated wiring substrate according to claim 8, wherein the conductor pattern of the one of the pair of outer wiring substrates is positioned adjacent the conductor pattern of the intermediate wiring substrate to form a capacitor element.

10. A three-dimensional laminated wiring substrate comprising:

a plurality of wiring substrates disposed on top of each other, the plurality of wiring substrates including a pair of outer wiring substrates and an intermediate wiring substrate positioned between the pair of outer wiring substrates, each of the plurality of wiring substrates having:

an insulating film disposed along a surface thereof to provide a three-dimensional surface, a conductor pattern disposed on and extending along the three-dimensional surface; and an extension extending from an edge thereof;

the intermediate wiring substrate having a projection receiving passageway; and one of the pair of outer wiring substrates including a spacer projection formed of the insulating film extending through the projection receiving passageway and abutting a surface of another of the pair of outer wiring substrates.

11. The three-dimensional laminated wiring substrate according to claim 10, wherein each extension is staggered from each other so that each extension does not overlap with each other.

12. The three-dimensional laminated wiring substrate according to claim 11, wherein the conductor patterns of the plurality of wiring substrates extend along the extension of the plurality of wiring substrates.

13. A three-dimensional laminated wiring substrate comprising:

a plurality of wiring substrates disposed on top of each other, the plurality of wiring substrates including a pair of outer wiring substrates and an intermediate wiring substrate positioned between the pair of outer wiring substrates, each of the plurality of wiring substrates having:

an insulating film including a printing catalyst disposed along a surface thereof to provide a three-dimensional surface; and a conductor pattern disposed on and extending along the three-dimensional surface;

the intermediate wiring substrate having a projection receiving passageway; and one of the pair of outer wiring substrates including a spacer projection formed of the insulating film extending through the projection receiving passageway and abutting a surface of another of the pair of outer wiring substrates.

\* \* \* \* \*